(12) United States Patent
Lou et al.

(10) Patent No.: US 6,372,653 B1
(45) Date of Patent: Apr. 16, 2002

(54) METHOD OF FORMING DUAL DAMASCENE STRUCTURE

(75) Inventors: Chine-Gie Lou; Su-Yuan Chang, both of Hsinchu Hsien (TW)

(73) Assignee: Taiwan Semiconductor Manufacturing Co., LTD, Hsinchu (TW)

( * ) Notice: Subject to any disclaimer, the term of this patent is extended or adjusted under 35 U.S.C. 154(b) by 97 days.

(21) Appl. No.: 09/611,563

(22) Filed: Jul. 7, 2000

(51) Int. Cl.⁷ .......................................... H01L 21/3065
(52) U.S. Cl. ...................... 438/706; 438/712; 438/714; 438/717; 438/725
(58) Field of Search ................................ 438/706, 712, 438/714, 622, 618, 634, 638, 717, 725

(56) References Cited

U.S. PATENT DOCUMENTS

| | | | | |
|---|---|---|---|---|
| 6,103,616 A | * | 4/2000 | Yu et al. ...................... | 438/622 |
| 6,207,577 B1 | * | 3/2001 | Wang et al. ................. | 438/706 |
| 6,211,063 B1 | * | 4/2001 | Liu et al. .................... | 438/624 |
| 6,218,079 B1 | * | 4/2001 | Shin et al. .................. | 430/314 |
| 6,268,283 B1 | * | 7/2001 | Huang ......................... | 438/638 |
| 6,312,874 B1 | * | 11/2001 | Chan et al. .................. | 430/314 |

* cited by examiner

Primary Examiner—Benjamin L. Utech
Assistant Examiner—Binh X. Tran
(74) Attorney, Agent, or Firm—J.C. Patents

(57) ABSTRACT

A method of forming a dual damascene structure. A first organic low dielectric constant dielectric layer, a heat diffusion layer and a second organic low dielectric constant dielectric layer are formed sequentially over a substrate. A first mask layer having a via opening pattern and a second mask layer having a trench pattern are formed sequentially over the second organic. The second organic low dielectric constant dielectric layer exposed by the via opening pattern is etched using the first mask layer as a hard mask layer. The heat diffusion layer exposed by the first mask layer and the via opening in the trench region are removed using the second mask layer and the second organic low dielectric constant dielectric layer as masks. Hence, the trench pattern and the via opening pattern are transferred to the first mask layer and the heat diffusion layer, respectively. The second and the first organic low dielectric constant dielectric layer are etched using the second mask layer and the heat diffusion layer as a hard mask. Ultimately, the trench and via opening of a dual damascene structure are formed.

20 Claims, 8 Drawing Sheets

METHOD OF FORMING DUAL DAMASCENE STRUCTURE

BACKGROUND OF THE INVENTION

1. Field of Invention

The present invention relates to a method of forming multi-level interconnect for connecting semiconductor devices. More particularly, the present invention relates to a method of forming a dual damascene structure.

2. Description of Related Art

In the semiconductor industry, much effort is spent in developing semiconductor devices with ever-increasing operating speed. Due to rapid progress in integrated circuit fabrication technologies, resistance of conductive lines and parasitic capacitance resulting from inter-layer dielectric layers have become two main factors affecting the circuit's operating speed. To reduce resistance, low resistance metallic material is often used to form the conductive lines. On the other hand, to reduce parasitic capacitance due to inter-layer dielectric, low dielectric constant material is often used to form the insulation layer between multi-level metallic interconnects.

Conventional metallic interconnects are formed by depositing metal into an opening to form a metal plug and then electrically connecting the metal plug to a conductive line, such as an aluminum line, by forming the conductive line over the substrate. More recently, a dual damascene process has been used to produce high-reliability, low cost metallic lines. In a dual damascene process, material for forming the metallic interconnects is no longer restricted by etching property. Copper, which is one of the principle materials employed in a forming dual damascene structure, is widely adopted due to its intrinsically low electrical resistance. In addition, dielectric layers having low dielectric constants are used inside a dual damascene structure as the level of integration increases.

FIGS. 1A through 1E are schematic cross-sectional views showing the progression of steps for producing a conventional dual damascene structure. As shown in FIG. 1A, a dielectric layer 102 and a silicon nitride layer 104 are formed sequentially over a substrate 100. A photoresist layer 106 having a via opening 108 is formed therein over the silicon nitride layer 104.

As shown in FIG. 1B, the silicon nitride layer 104 is etched using the photoresist layer as a mask. Hence, the via opening 108 in the photoresist layer 106 is transferred to the silicon nitride layer 104 to form an opening 110. Another dielectric layer 112 is formed over the substrate 100, and then another photoresist layer 114 having a trench pattern 116 is formed therein over the dielectric layer 112.

As shown in FIG. 1C, the dielectric layer 112 is etched using the photoresist layer 114 as a mask to form a trench 120. After the silicon nitride layer 104 is exposed, etching continues down the dielectric layer 102 exposed by the opening 110 to form another via opening 118.

As shown in FIG. 1D, oxygen plasma ($O_2$ plasma) is used to remove the photoresist layer 114.

As shown in FIG. 1E, metal is deposited to fill the openings 118 and the trench 120 to form a metallic layer 122. A chemical-mechanical polishing (CMP) operation is next conducted to remove the excess metallic material above the dielectric layer 112. Hence, a metallic layer 122 that fills the opening 118 and the trench 120 is formed.

As the level of integration of devices in an integrated circuit increases, parasitic capacitance problems caused by an intermediate inter-metal dielectric layer sandwiched between two metallic layers will intensify. To reduce resistance-capacitance time delay due to parasitic capacitance, a low dielectric constant material is often used to form the inter-metal dielectric layer, particularly in a deep sub-micron process.

However, most photoresist layers are produced using high molecular weight compounds, and most low dielectric constant dielectric layers are produced using high molecular weight organic compounds. Hence, when the photoresist layer 114 is removed by oxygen plasma, sidewalls of the via opening 118 and the trench 120 of the low dielectric constant organic dielectric layers 112 and 102 may be damaged. The damaged regions (labeled 124 and 126 in FIG. 1D) will likely absorb moisture. The moisture absorbed by the dielectric layers 112 and 102 may poison the metallic material inside the trench 120 and the via opening 118 in the high-temperature metal deposition process.

In addition, the silicon nitride layer 104 is used as an etching stop layer in the process of forming the trench 120 as well as a hard mask layer in the process of forming the via opening 118. However, the dielectric constant of silicon nitride is rather high, at about seven. Hence, the resulting parasitic capacitance may lead to a high resistance-capacitance delay that affects the operating speed of the highly integrated circuit.

SUMMARY OF THE INVENTION

Accordingly, one object of the present invention is to provide a method of forming a dual damascene structure capable of preventing moisture absorption by a low dielectric constant dielectric layer during photoresist removal. Hence, subsequent via poisoning or metallic line poisoning by water is prevented.

A second object of this invention is to provide a method of forming a dual damascene structure capable of reducing the parasitic capacitance and increasing the operating speed of an integrated circuit device.

To achieve these and other advantages and in accordance with the purpose of the invention, as embodied and broadly described herein, the invention provides a method of forming a dual damascene structure. A first organic low dielectric constant dielectric layer, a heat diffusion layer and a second organic low dielectric constant dielectric layer are formed sequentially over a substrate. A first mask layer having a via opening pattern and a second mask layer having a trench pattern are formed sequentially over the second organic. The second organic low dielectric constant dielectric layer exposed by the via opening pattern is etched using the first mask layer as a hard mask layer. Hence, the via opening pattern on the first mask layer is transferred to the second organic low dielectric constant dielectric layer. The heat diffusion layer exposed by the first mask layer and the via opening in the trench region is removed using the second mask layer and the second organic low dielectric constant dielectric layer as a mask. Hence, the trench pattern and the via opening pattern are transferred to the first mask layer and the heat diffusion layer, respectively. The second organic low dielectric constant dielectric layer within the trench region and the first organic low dielectric constant dielectric layer within the via opening are etched using the second mask layer and the heat diffusion layer as a hard mask. Ultimately, the trench and via opening of a dual damascene structure are formed in the second and first organic low dielectric constant dielectric layers, respectively. Metal is deposited into the trench and the via opening. Then chemical-mechanical polishing is conducted to remove excess material from the metallic layer.

In the process of forming the dual damascene structure, a first photoresist layer and a second photoresist layer are used for transferring the trench pattern and the via opening pattern, respectively. The first photoresist layer is the first mask layer that contains the via opening pattern, and the second photoresist layer is the second mask layer that contains the trench pattern.

After the trench pattern on the first photoresist layer is transferred to the second mask layer, the first photoresist layer is removed by oxygen plasma. Since the second organic low dielectric constant dielectric layer is covered by the first mask layer, the surface of the dielectric layer is spared from plasma damages. Consequently, the removal of the first photoresist layer has no effect whatsoever on the final dual damascene structure.

Similarly, after the via opening pattern on the second photoresist layer is transferred to the first mask layer, the second photoresist layer is removed by oxygen plasma. The exposed surface of the second organic low dielectric constant dielectric layer may be damaged by the oxygen plasma. However, the damaged second organic low dielectric constant dielectric layer is removed in a subsequent process of forming a via opening in the layer. Consequently, the removal of the second photoresist layer also has no effect whatsoever on the final dual damascene structure.

In this invention, the plasma-damaged second dielectric layer is removed before the via opening is formed in the first dielectric layer and the trench pattern is formed in the second dielectric layer. In addition, after the process of forming the via opening in the first dielectric layer and the trench pattern in the second dielectric layer, but before the deposition of metal, no photoresist removal process needs to be carried out. Hence, moisture will not be absorbed by the sidewalls of the first and the second organic dielectric layers. In the subsequent metal deposition process, the poisoning of the via opening and metal line due to moisture emission is prevented.

In addition, silicon nitride is not used in the process of fabricating the dual damascene structure. In this invention, an aluminum nitride heat diffusion layer replaces the conventional silicon nitride layer. The aluminum nitride layer is formed between the two low dielectric constant dielectric layers. Hence, parasitic capacitance of circuit devices is reduced, and operating speed of the circuit devices is increased.

Inserting an aluminum nitride heat diffusion layer between two organic dielectric layers in place of a conventional silicon nitride layer not only reduces the dielectric constant of circuit devices and hence parasitic capacitance, but also increases heat diffusion capacity. High heat diffusion is beneficial because heat generated by the metal line in high-speed execution can be channeled away quickly. Ultimately, the reliability of circuit devices is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
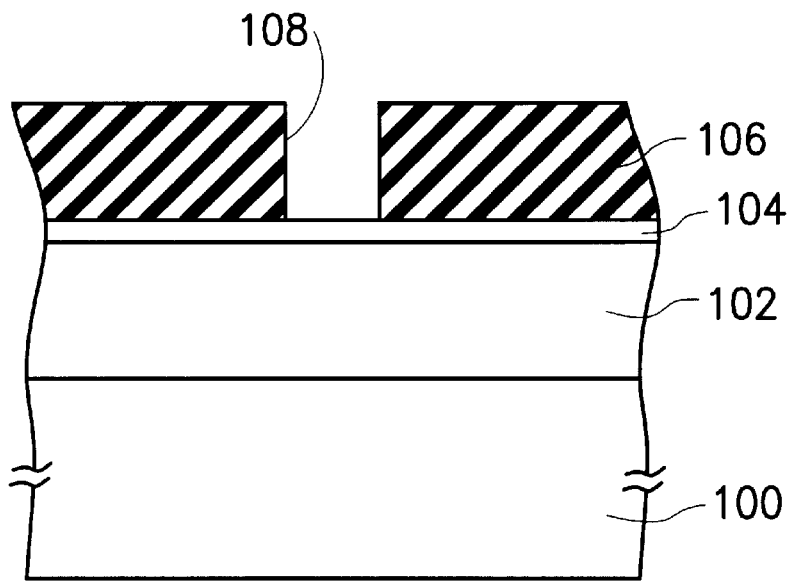
FIGS. 1A through 1E are schematic cross-sectional views showing the progression of steps for producing a conventional dual damascene structure.
Figure 1B:
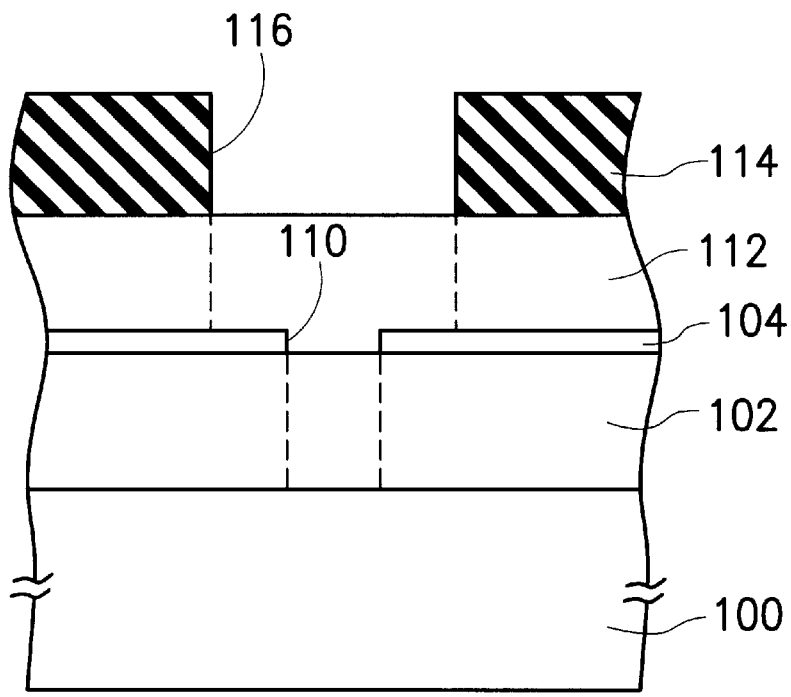
Figure 1C:
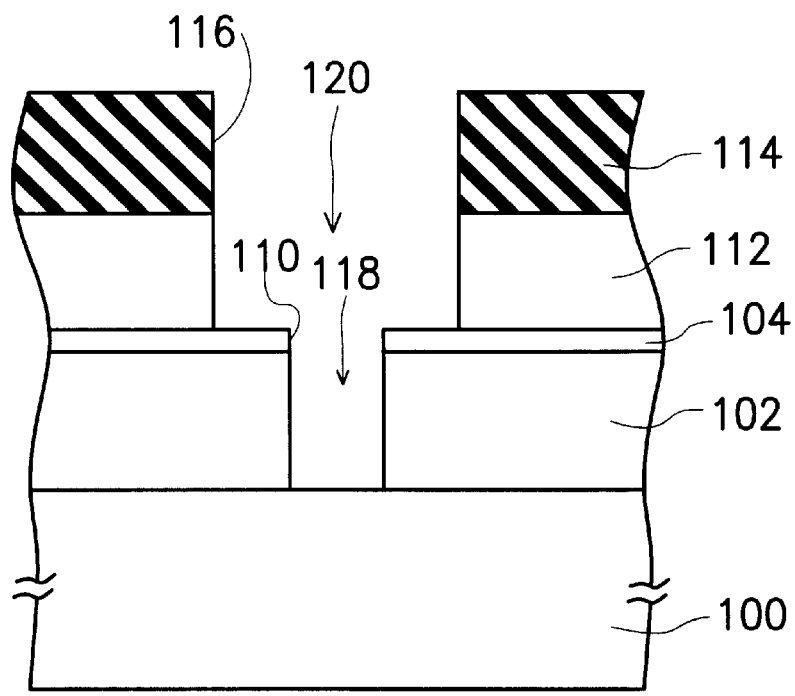
Figure 1D:
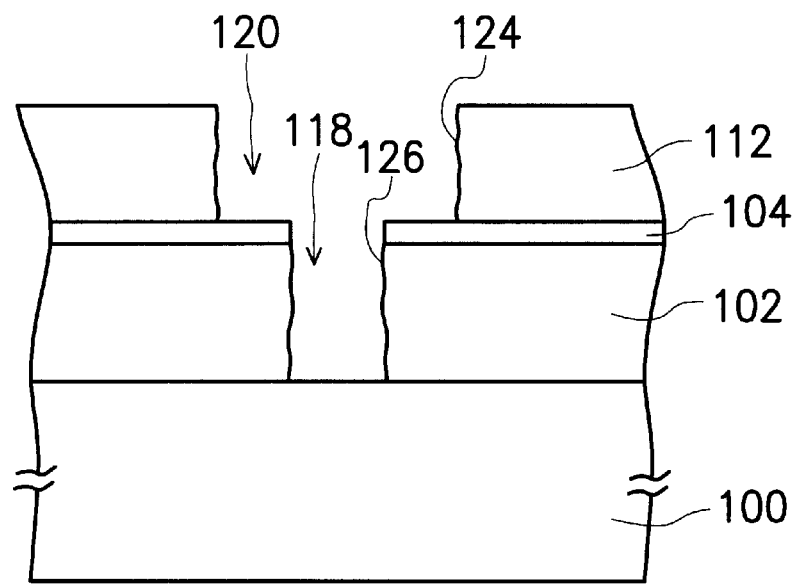
Figure 1E:
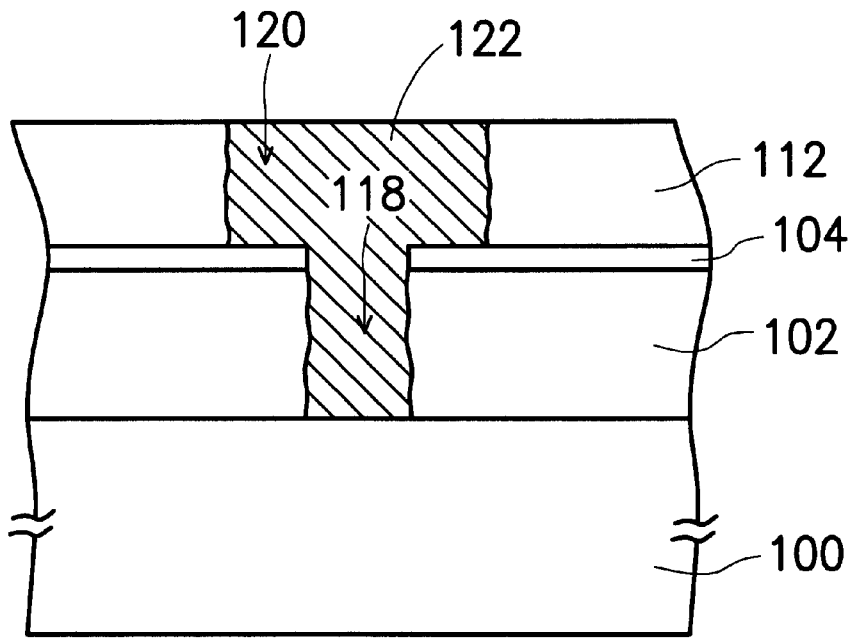

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2J are schematic cross-sectional views showing the progression of steps for producing a dual damascene structure according to one preferred embodiment of this invention.

Figure 2A:
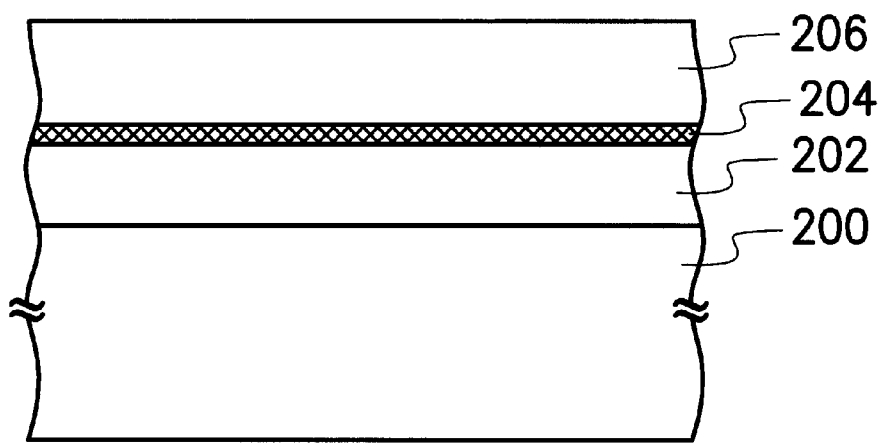
FIGS. 2A through 2J are schematic cross-sectional views showing the progression of steps for producing a dual damascene structure according to one preferred embodiment of this invention.

As shown in FIG. 2A, a dielectric layer 202, a diffusion layer 204 and a dielectric layer 206 are formed sequentially over a substrate 200. The dielectric layers 202 and 206 are preferably low dielectric constant spin on polymer (SOP) layers. For example, the SOP may be an organic material such as Flare, SILK, Parylene or PAE-II. The dielectric layer 202 has a thickness of between 2000 Å to 3500 Å, and the dielectric layer 206 has a thickness of between 2500 Å to 5000 Å. The diffusion layer is preferably formed using a material having high heat dissipation and a low dielectric constant of less than four. In addition, the diffusion layer 204 must have an etching rate that differs from the dielectric layers 202 and 206. The diffusion layer 204 can be an aluminum nitride layer having a dielectric constant of between three and four, for example. The aluminum nitride layer preferably has a thickness of between 500 Å to 2000 Å and is formed, for example, by physical vapor deposition.

Figure 2B:
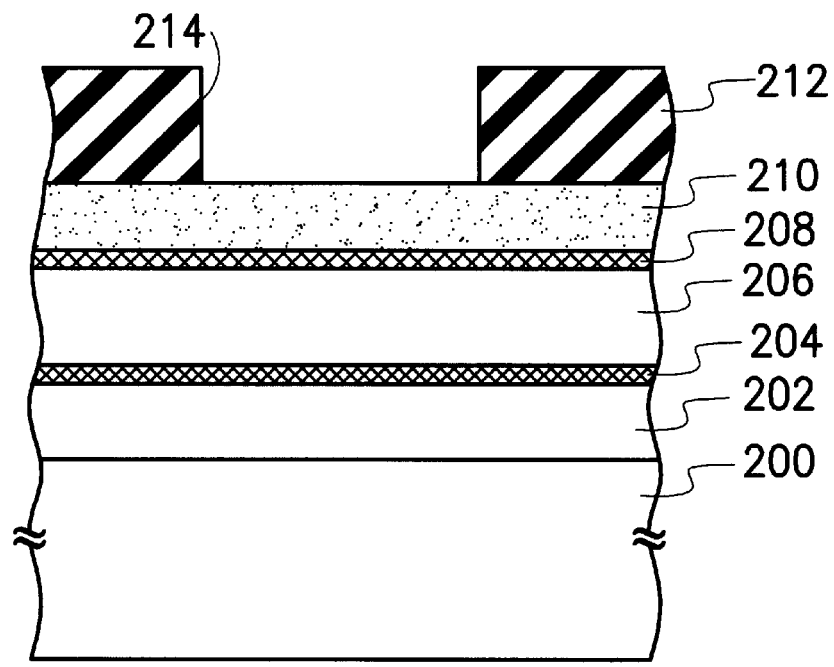

As shown in FIG. 2B, a first mask layer 208 and a second mask layer 210 are formed sequentially over the dielectric layer 206. The mask layer 208 and the dielectric layer 202 have different etching rates. The first mask layer 208 has a thickness of between 500 Å to 2000 Å and can be an aluminum nitride layer formed, for example, by physical vapor deposition. The second mask layer 210 has a different etching rate than that of the other layers, including the first mask layer 208, the dielectric layer 206, the diffusion layer 204 and the dielectric layer 202. The second mask layer 210 has a thickness of between 1000 Å to 2000 Å and can be a tungsten nitride formed, for example, by chemical vapor deposition. A photoresist layer having a trench pattern 214 is formed over the second mask layer 210 for patterning the second mask layer 210.

Figure 2C:
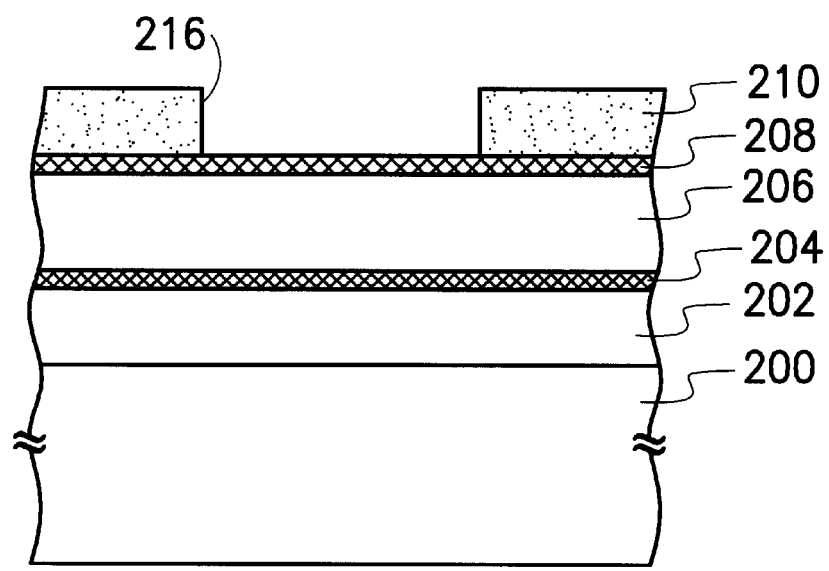

As shown in FIG. 2C, the second mask layer 210 that is exposed by the photoresist layer 212 is removed using the first mask layer 208 as an etching stop layer. In other words, the trench pattern 214 on the photoresist layer 212 is transferred to the second mask layer 210. The second mask layer 210 exposed by the photoresist layer 212 is removed, for example, by performing an anisotropic etching such as a reactive ion etching (RIE) operation.

The photoresist layer 212 is removed next using oxygen plasma to expose the first mask layer 208. Since the dielectric layer 206 is entirely covered, the dielectric layer 206 is spared from any damaging effects caused by the etching plasma.

Figure 2D:
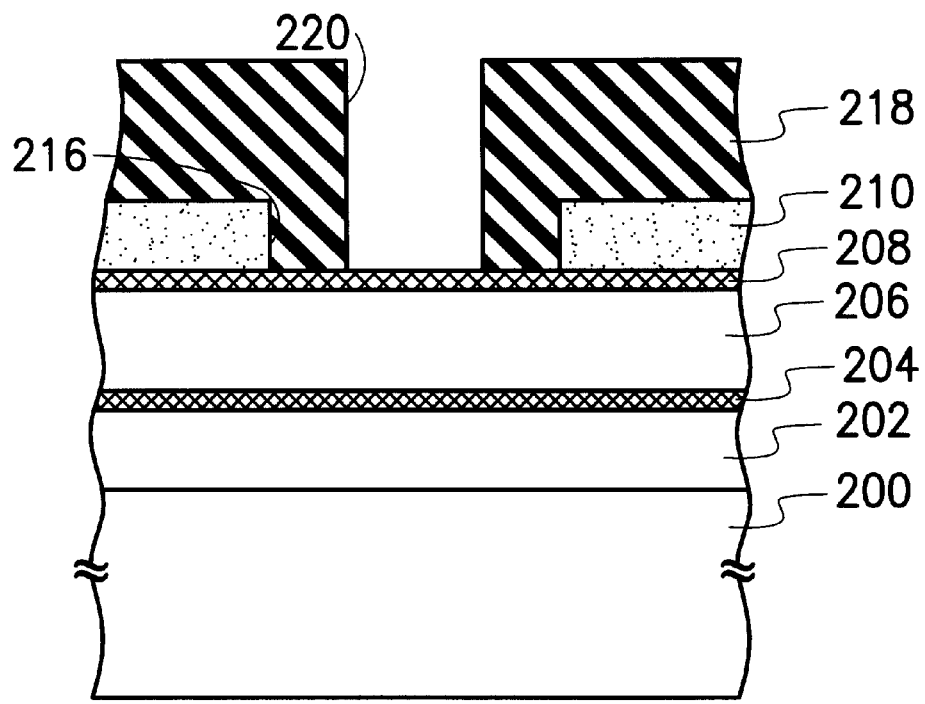

As shown in FIG. 2D, another photoresist layer 218 is formed over the substrate 200. The photoresist layer 218 has a via opening pattern 220 that exposes a portion of the first mask layer 208 in the trench region 216.

Figure 2E:
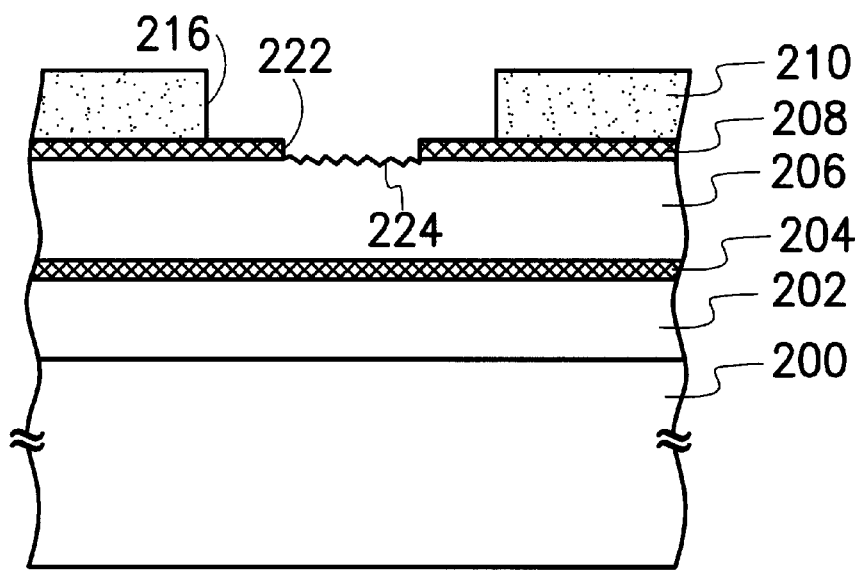

As shown in FIG. 2E, the first mask layer 208 that is exposed by the photoresist layer 218 is removed to form a via opening 222. Hence, the via pattern 220 on the photoresist layer 218 is transferred to the mask layer 208. The mask layer 208 is removed, for example, by performing an anisotropic etching such as a reactive ion etching (RIE) operation.

Similarly, the photoresist layer 218 is removed using oxygen plasma. During the plasma etching operation, a top layer of the exposed dielectric layer 206 in the via opening 222 may be damaged, as indicated by the wavy line and label 224. However, the damaged layer 224 of the dielectric layer 206 will be removed in a subsequent operation. Therefore, such damages are unlikely to affect the resulting dual damascene structure.

Figure 2F:
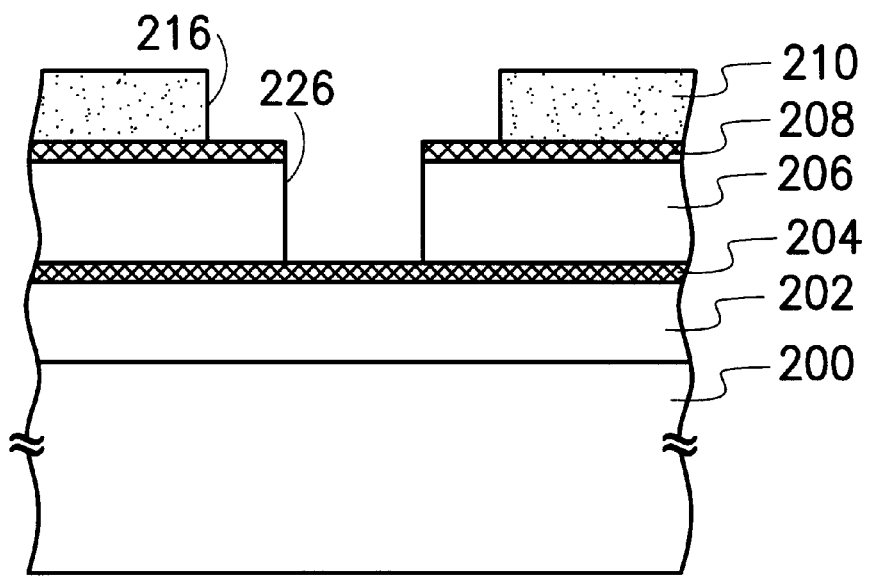

As shown in FIG. 2F, an anisotropic etching such as a reactive ion etching (RIE) is conducted to etch the dielectric layer 206 that is exposed through the via opening 222 using the mask layer 208 as a hard mask. Hence, the pattern on the mask layer 208 is transferred to the dielectric layer 206 forming a via opening 226. In this etching operation, the plasma-damaged region 224 on the dielectric layer 206 is also removed.

Figure 2G:
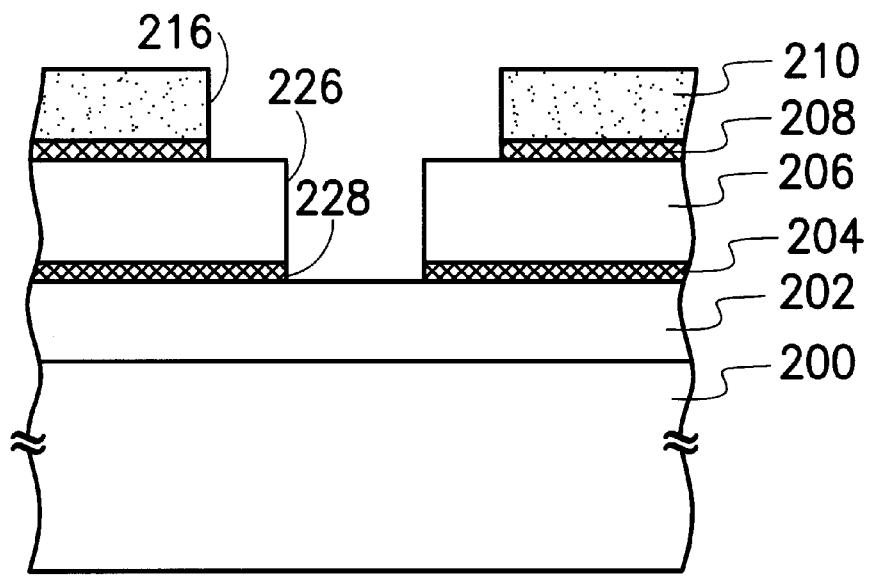

As shown in FIG. 2G, using the mask layer 210 and the dielectric layer 206 as a mask, and the dielectric layer 206 as an etching stop layer, an anisotropic etching, such as reactive ion etching, is carried out. Ultimately, the mask layer 208 that is exposed by the trench pattern 216 and the diffusion layer 204 that is exposed by the via opening 226 are removed. The trench pattern 216 is transferred to the mask layer 208, and the via opening pattern 206 is transferred to the heat diffusion layer 204 to form a via opening 228. In other words, the mask layers 208 and 210 now have the trench pattern 216, while the dielectric layer 206 and the heat diffusion layer 204 have the via opening pattern 226. The via opening 226 and the trench opening 216 together make a mold necessary for forming a dual damascene structure.

Figure 2H:
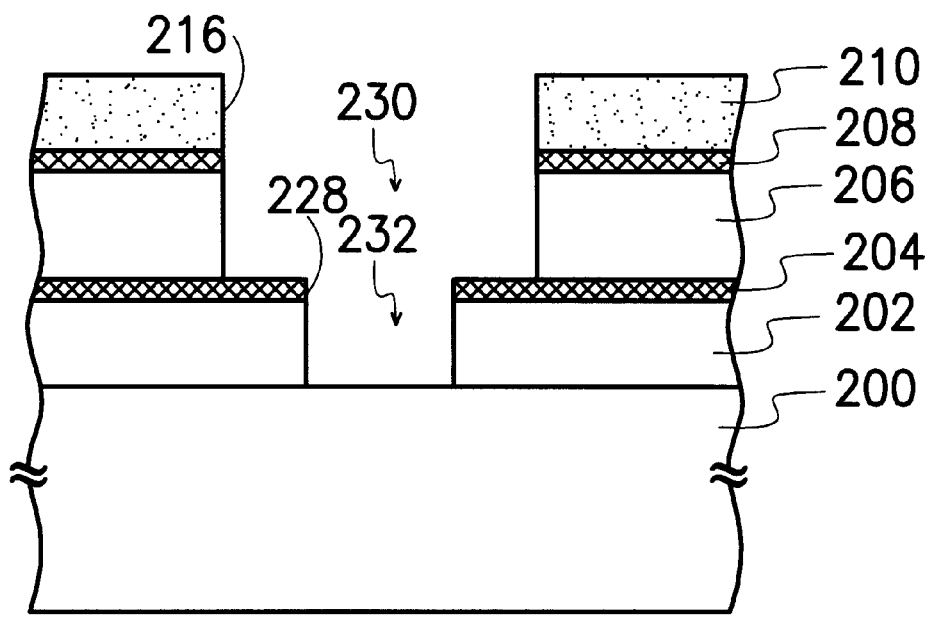

As shown in FIG. 2H, using the mask layer 210 and the heat diffusion layer 204 as a mask and using the heat diffusion layer 204 and the substrate 200 as an etching stop layer, an anisotropic etching, such as reactive ion etching, is carried out to remove a portion of the exposed dielectric layer 206 and the dielectric layer 202. The trench pattern 216 on the mask layer 210 is transferred to the dielectric layer 206 to form a trench 230. In the meantime, via opening pattern 228 on the heat diffusion layer 204 is also transferred to the dielectric layer 202 to form a via opening 232. In other words, the trench pattern 216 on the mask layer 210 and the via opening pattern 228 on the heat diffusion layer 204 are transferred to the dielectric layer 206 and the dielectric layer 202 in a single etching to form the trench 230 and the via opening 232 necessary for forming the dual damascene structure.

Figure 2I:
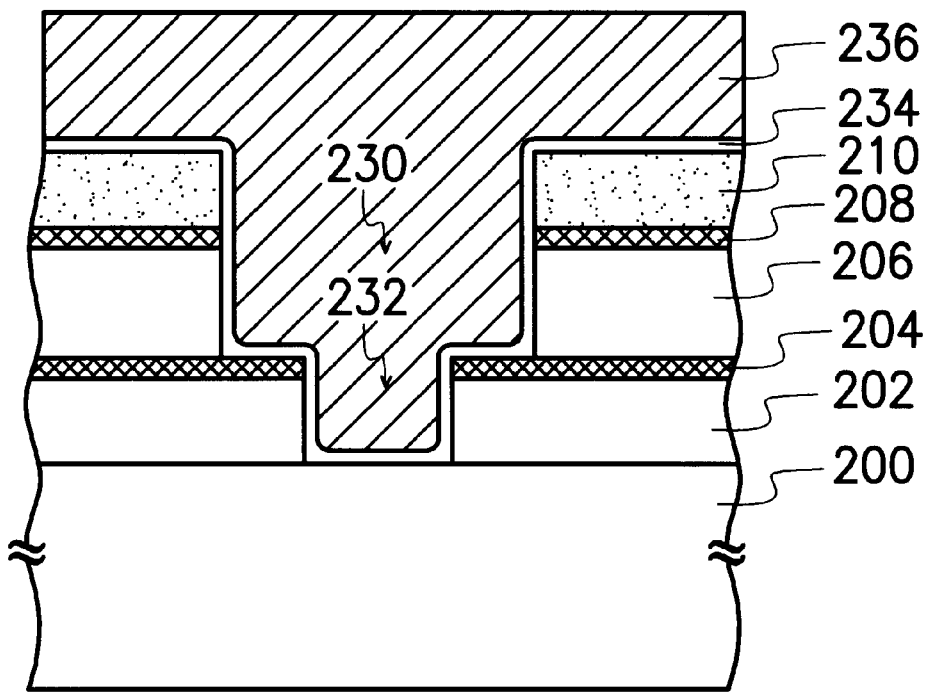

As shown in FIG. 2I, a barrier layer 234 is formed over the mask layer 210, the trench 230 and the via opening 232. The barrier layer 234 can be formed, for example, by chemical vapor deposition using a material such as tungsten nitride, titanium nitride, tantalum nitride or another substance with similar properties. Metallic material is deposited over the substrate 200 to fill the trench 230 and the via opening 232 to form a metallic layer 236. The metallic layer 236 can be formed, for example, by chemical vapor deposition of copper.

Figure 2J:
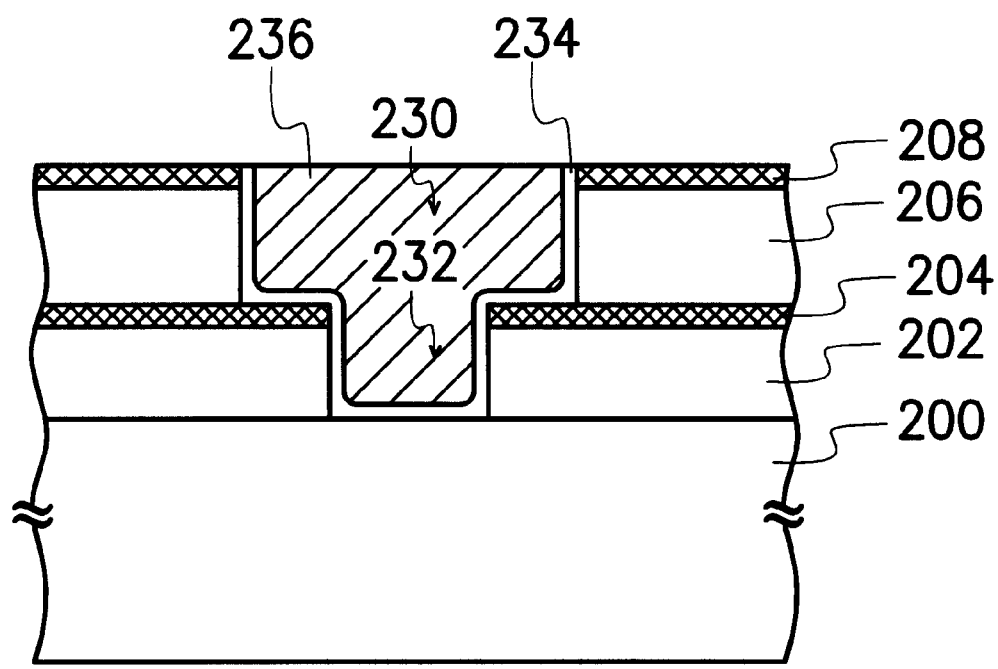

As shown in FIG. 2J, the metallic layer 236 lying above the mask layer 208 is removed, for example, by chemical-mechanical polishing using the mask layer 208 as a polishing stop layer. If the mask layer 208 is a silicon nitride layer (having high heat dissipation and a dielectric constant between three to four), the layer can be retained after chemical-mechanical polishing. This is because the silicon nitride layer can be used as a heat diffusion layer for metallic lines.

In the process of forming the dual damascene structure, the photoresist layer 212 is used for transferring the trench pattern 214 to the mask layer 210. Similarly, the photoresist layer 218 is used for transferring the via opening pattern 220 to the mask layer 208.

After the trench pattern 214 on the first photoresist layer 212 is transferred to the mask layer 210, oxygen plasma is used to remove the first photoresist layer 212. Since the second low dielectric constant dielectric layer 206 is covered by the mask layer 208, the dielectric layer 206 is protected against any damages during the plasma removal process. Hence, the process of removing the first photoresist layer 212 will have no effect on the final dual damascene structure.

Similarly, after the via opening pattern 220 on the second photoresist layer 218 is transferred to the mask layer 208, the second photoresist layer 218 is removed by oxygen plasma. The exposed surface of the second organic low dielectric constant dielectric layer 206 may be damaged by the oxygen plasma. However, the damaged second organic low dielectric constant dielectric layer 206 is removed in a subsequent process of forming a via opening 226 in the layer. Consequently, the process of removing the second photoresist layer 218 also has no effect whatsoever on the final dual damascene structure.

In this invention, the plasma-damaged second dielectric layer 206 (label 224 in FIG. 2E) is removed before the via opening 232 is formed in the first dielectric layer 202 and the trench pattern 230 is formed in the second dielectric layer 206. In addition, after the process of forming via opening 232 in the first dielectric layer 202 and the trench pattern 230 in the second dielectric layer 206, but before the deposition of metal layer 236, no photoresist removal process is carried out. Hence, moisture will not be absorbed by the sidewalls of the first and the second organic dielectric layers 202 and 206. In a subsequent metal deposition process, the poisoning of the via opening and metal line due to moisture emission is prevented.

In addition, silicon nitride is not used in the process of fabricating the dual damascene structure. In this invention, an aluminum nitride heat diffusion layer 204 replaces the conventional silicon nitride layer. The aluminum nitride layer 204 is formed between the two low dielectric constant dielectric layers 202 and 206. Hence, parasitic capacitance of circuit devices is reduced, and operating speed of the circuit devices is increased.

Inserting the aluminum nitride heat diffusion layer 204 between two organic dielectric layers 202 and 206 (in place of a conventional silicon nitride layer) not only reduces the dielectric constant of circuit devices and hence parasitic capacitance, but also increases heat diffusion capacity. High heat diffusion is beneficial because heat generated by the metal line in high-speed execution can be channeled away quickly. Ultimately, the reliability of circuit devices is improved.

In summary, the advantages of the invention include:
1. The poisoning of the via opening and metallic line by moisture is prevented.

2. Low dielectric constant dielectric layers and heat diffusion layer are used, thereby reducing parasitic capacitance and increasing the operating speed of circuit devices.

3. The heat diffusion layer is capable of channeling away a portion of the heat generated by metallic lines. Consequently, the reliability of the circuit devices improves.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure, comprising the steps of:

provide a substrate;

sequentially forming a first dielectric layer, a heat diffusion layer and a second dielectric layer over the substrate;

forming a first mask layer over the second dielectric layer, wherein the first mask layer has a via opening that exposes a portion of the second dielectric layer;

forming a second mask layer over the first mask layer, wherein the second mask layer has a trench that exposes a portion of the first mask layer and the second dielectric layer;

removing the second dielectric layer exposed by the via opening using the first mask layer as a hard mask and the heat diffusion layer as a stopping layer so that the via opening pattern is transferred to the second dielectric layer;

removing the first mask layer that is exposed by the trench and the heat diffusion layer that is exposed by the via opening using the second mask layer and the second dielectric layer as a hard mask so that the trench pattern is transferred to the first mask layer and the via opening pattern is transferred to the heat diffusion layer;

removing the second dielectric layer that is exposed by the trench and the first dielectric layer that is exposed by the via opening using the second mask layer and the heat diffusion layer as a mask so that a trench is formed in the second dielectric layer and a via opening is formed in the first dielectric layer;

forming a metallic layer that fills the trench and the via opening; and removing the second mask layer.

2. The method of claim 1, wherein material forming the first and the second dielectric layers include organic low dielectric constant substance.

3. The method of claim 1, wherein a value of the dielectric constant of the heat diffusion layer is less than four.

4. The method of claim 1, wherein the first mask layer has an etching rate that differs from the second dielectric layer.

5. The method of claim 4, wherein material forming the first mask layer includes aluminum nitride and material forming the second dielectric layer includes an organic low dielectric constant substance.

6. The method of claim 1, wherein the etching rate of the second mask layer differs from the etching rates of other layers including the first mask layer, the second dielectric layer, the heat diffusion layer and the first dielectric layer.

7. The method of claim 6, wherein material forming the second mask layer includes tungsten nitride, material forming the first and the second dielectric layer includes organic low dielectric constant substance and material forming the heat diffusion layer includes aluminum nitride.

8. The method of claim 1, wherein the step of forming the metallic layer in the trench and the via opening includes the sub-steps of:

depositing metallic material over the second mask layer to fill the trench and the via opening; and removing excess metallic material above the first mask layer by chemical-mechanical polishing.

9. The method of claim 8, wherein before the step of depositing metallic material over the second mask layer, further includes a step of forming a barrier layer lining the interior trench surface and the via opening surface.

10. The method of claim 1, wherein the step of forming the first mask layer and the second mask layer includes the sub-steps of:

forming a first material layer and a second material layer over the second dielectric layer;

forming a first photoresist layer over the second material layer, wherein the first photoresist layer has a trench pattern;

etching the second material layer exposed by the trench using the first photoresist layer as a mask so that the trench pattern is transferred to the second material layer forming the second mask layer;

removing the first photoresist layer;

forming a second photoresist layer over the substrate, wherein the second photoresist layer has a via opening pattern that exposes the first material layer;

etching the first material layer exposed by the via opening using the second photoresist layer as a mask so that the via opening pattern is transferred to the first material layer forming the first mask layer; and removing the second photoresist layer.

11. The method of claim 10, wherein material forming the first material layer includes aluminum nitride.

12. The method of claim 10, wherein material forming the second material layer includes tungsten nitride.

13. The method of claim 10, wherein the step of removing the first photoresist layer includes plasma etching using oxygen.

14. The method of claim 10, wherein the step of removing the second photoresist layer includes plasma etching using oxygen.

15. A method of forming a dual damascene structure, comprising the steps of:

providing a substrate;

sequentially forming a first organic low dielectric constant dielectric layer, a first aluminum nitride layer and a second organic low dielectric constant dielectric layer over the substrate;

forming a second aluminum nitride layer over the second organic low dielectric constant dielectric layer, wherein the second aluminum nitride layer has a via opening that exposes a portion of the second organic low dielectric constant dielectric layer;

forming a tungsten nitride layer over the second aluminum nitride layer, wherein the tungsten nitride layer has a trench that exposes a portion of the second aluminum nitride layer and the second organic low dielectric constant dielectric layer;

removing the second organic low dielectric constant dielectric layer that is exposed by the via opening using the second aluminum nitride layer as a hard mask and the first aluminum nitride layer as a stopping layer so that the via opening pattern is transferred to the second organic low dielectric constant dielectric layer;

removing the second aluminum nitride layer that is exposed by the trench and the first aluminum nitride layer that is exposed by the via opening using the tungsten nitride layer and the second organic low dielectric constant dielectric layer as a hard mask so that the trench pattern is transferred to the second aluminum nitride layer and the via opening pattern is transferred to the first aluminum nitride layer;

removing the second organic low dielectric constant dielectric layer that is exposed by the trench and the first organic low dielectric constant dielectric layer that is exposed by the via opening using the tungsten nitride layer and the firs t aluminum nitride layer as a mask so that a trench is formed in the second organic low dielectric constant dielectric layer and a via opening is formed in the first organic low dielectric constant dielectric layer;

forming a metallic layer that fills the trench and the via opening; and removing the tungsten nitride layer.

16. The method of claim 15, wherein the step of forming the metallic layer in the trench and the via opening includes the sub-steps of:

depositing metallic material over the tungsten nitride layer to fill the trench and the via opening; and removing excess metallic material above the tungsten nitride layer by chemical-mechanical polishing.

17. The method of claim 16, wherein before the step of depositing metallic material over the tungsten nitride layer, further includes a step of forming a barrier layer lining the interior trench surface and the via opening surface.

18. The method of claim 15, wherein the step of forming the second aluminum nitride layer and the tungsten nitride layer includes the sub-steps of:

forming an aluminum nitride layer and a tungsten nitride layer over the second organic low dielectric constant dielectric layer;

forming a first photoresist layer over the tungsten nitride layer, wherein the first photoresist layer has a trench pattern;

etching the tungsten nitride layer exposed by the trench using the first photoresist layer as a mask so that the trench pattern is transferred to the tungsten nitride layer;

removing the first photoresist layer;

forming a second photoresist layer over the substrate, wherein the second photoresist layer has a via opening pattern that exposes the second aluminum nitride layer;

etching the second aluminum nitride layer exposed by the via opening using the second photoresist layer as a mask so that the via opening pattern is transferred to the second aluminum nitride layer; and removing the second photoresist layer.

19. The method of claim 18, wherein the step of removing the first photoresist layer includes plasma etching using oxygen.

20. The method of claim 18, wherein the step of removing the second photoresist layer includes plasma etching using oxygen.

* * * * *